March 18, 1969 C. R. HUNTLEY 3,434,066
LOW-DISTORTION BIAS-CONTROLLED TRANSISTOR AMPLIFIER
Filed June 16, 1966
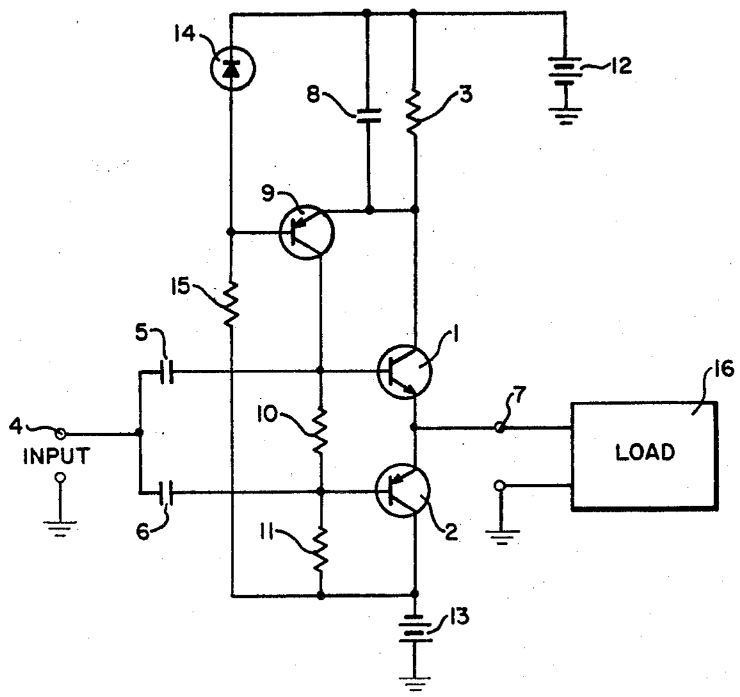
INVENTOR.
CHRISTOPHER R. HUNTLEY
BY Glenn H. Antrim
AGENT United States Patent Office 3,434,066
Patented Mar. 18, 1969

3,434,066
LOW-DISTORTION BIAS-CONTROLLED TRANSISTOR AMPLIFIER

Christopher R. Huntley, New Westminster, British Columbia, Canada, assignor to Automatic Electric Laboratories, Inc., Northlake, Ill., a corporation of Delaware
Filed June 16, 1966, Ser. No. 558,088
U.S. Cl. 330—13 3 Claims
Int. Cl. H03f 3/18, 3/26, 3/68

ABSTRACT OF THE DISCLOSURE

In a class AB amplifier, usual emitter bias resistors are omitted, and both emitters of a pair of complementary transistors are connected directly to a load. The elimination of the usual emitter bias resistors decreases distortion previously caused by change in resistance in the load of the amplifier at the cross-over operating point of the transistors. A by-passed resistor is inserted in the collector circuit of one of the transistors, and control voltage developed across the resistor by average current flow in the collector-emitter circuits is used to control a direct-current amplifier stage. The output of the direct-current amplifier supplies bias voltage for the bases of the complementary transistors. The controlled bias maintains the average collector-emitter current substantially constant at different levels of AB operation.

This invention relates to low-distortion, bias-controlled transistor amplifiers and more particularly to push-pull amplifiers having transistors connected in a complementary-symmetry arrangement and bias circuits for controlling average emitter-collector current in modified class AB operation.

In prior amplifiers using complementary-symmetry, common-emitter transistor output stages, bias resistors are included in the emitter circuits to provide minimum quiescent current. The inclusion of the bias resistors in amplifiers decreases crossover distortion substantially. However, the extent of the decrease in distortion is limited because another source of distortion arises as a result of the introduction of the bias resistors at a point in common with an output load. When the bias resistors are added, the output circuit is nonlinear because only one of the two emitter bias resistors is effectively in series with the load when signal amplitude in the amplifier is low, but both emitter bias resistors are in parallel with each other and in series with the load when signal amplitude is high.

An object of this invention is to decrease distortion originating in forward-biased, common-emitter transistor amplifiers, particularly in push-pull amplifiers of the type which use complementary-symmetry transistor circuits.

Another object is to provide transistor amplifiers which consume moderate current from their sources of power, and provide moderate output with unusually low distortion.

Briefly, in the present invention the foregoing objects are attained by connecting the emitters of two transistors directly together for connection to an output load. Therefore, the bias resistors used in the prior art amplifiers have been eliminated.

In the circuit according to the invention, an amplifier has a current-control circuit that monitors the average current of the series emitter-collector circuit and applies to the bases of the complementary pair of transistors the required bias for maintaining the average emitter-collector current constant at a predetermined value regardless of the level of signal within the capacity of the amplifier. The amplifier has both class A and class AB qualities.

The invention may be more readily understood by reference to the accompanying drawing, the single figure of which is a schematic diagram of an embodiment of the amplifier of this invention.

The illustrated amplifier is a push-pull stage including complementary transistors 1 and 2 having their emitter-collector circuits connected in series. The collector of the type NPN transistor 1 is connected through a series resistor 3 to a source 12 of positive operating voltage, and the collector of the type PNP transistor 2 is connected to a source 13 of negative operating voltage. An input terminal 4 is connected through coupling capacitors 5 and 6 to the bases of the transistors 1 and 2, respectively. Output terminal 7 for the load 16 is connected directly to the emitters of both transistors 1 and 2. A bypass capacitor 8 is connected across the series resistor 3. The capacity of the capacitor 8 is large enough to provide adequate filtering at signal frequencies, yet small enough to allow rapid changes in voltage across the resistor 3 in response to changes in average emitter-collector current flow.

Biasing for the transistors 1 and 2 is provided by a direct-current amplifier including a transistor 9 and a voltage divider connected to the collector of the transistor 9. The emitter-to-base circuit of the transistor 9 comprises an input circuit of the direct-current amplifier, and the collector-to-emitter circuit comprises an output circuit of the amplifier. The emitter of the transistor 9 is connected through the series resistor 3 to the positive terminal of the source of voltage 12, and its collector is connected to a terminal of the resistor 10 and to the base of the transistor 1. The opposite terminal of the resistor 10 is connected to a terminal of resistor 11 and to the base of the transistor 2, and finally the opposite terminal of the resistor 11 is connected to the negative terminal of the source of voltage 13. The bias voltage for the bases of the transistor 1 and 2 is controlled according to the conductivity of the transistor 9. To control the conductivity of this transistor, its base is connected to a point of constant voltage and its emitter is connected to the collector of the transistor 1 such that voltage variations across the resistor 3 which result from change in average collector current of the transistors 1 and 2 is applied between the emitter and the base of the transistor 9.

A constant voltage drop across a breakdown diode 14 supplies the constant voltage for the base of the transistor 9. The constant voltage circuit includes a resistor 15 connected in series with the diode 14, the resistor being connected between the base of the transistor 9 and the negative terminal of the source 13, and the diode 14 being connected in a reverse direction between the base and the positive terminal of the source 12. The circuit arrangement for sensing change in the emitter-collector current of the transistors 1 and 2 is a bridge with a voltage reference 14 in one arm. The resistor 15 and the breakdown diode 14 form one arm, and the series resistor 3 and the emitter-collector circuits of the transistors 1 and 2 form the other arm. The base-emitter circuit of the transistor 9 is the diagonal. Normally, the bridge is unbalanced only slightly to provide required base-emitter current for the transistor 9. An abnormal unbalance of the bridge causes a change in collector current of the transistor 9, and an attendant change in bias voltages of the transistors 1 and 2, for substantially rebalancing the bridge to achieve the desired regulation of current flow through the emitter-collector circuits of the transistors 1 and 2.

The voltage drop across the resistor 3 is approximately equal to the breakdown voltage of the diode 14. The current through the transistors 1 and 2 must be somewhat greater than that required for the largest signal. When the sine wave output current has a peak current equal to $i_{max}$, the average current flow is somewhat greater than $$\frac{i_{max}}{2\sqrt{2}}$$

Obviously, the value of the resistor 3 is somewhat less than the voltage drop across the diode 14 divided by $$\frac{i_{max}}{2\sqrt{2}}$$

In operation, assume that, as a result of an increase in signal input the average or filtered emitter-collector current of the transistors 1 and 2 tends to rise above its normal value. The change in voltage on the emitter of the transistor 9 causes a decrease in emitter current and a corresponding decrease in collector current for decreasing the bias voltage drop across the resistor 10. The resulting decrease in base-to-emitter bias for each of the transistors 1 and 2 tends to decrease their emitter-collector current as required to maintain it substantially constant. Similarly, when the emitter-collector current of the transistors 1 and 2 tends to decrease below its normal value the control current changes in an opposite direction to provide the required correction.

A brief mathematical explanation readily shows the advantage of using the present current control circuit to eliminate the emitter bias resistors used in prior circuits. In a prior circuit, a resistor having a value $R_1$ is connected between the emitter of one transistor, which corresponds to the transistor 1, and an output terminal corresponding to the terminal 7; and a resistor having a value $R_2$ is connected between the emitter of the other transistor, which corresponds to the transistor 2, and the same output terminal. Let the input voltage to the transistors be represented by $V_1$, their output voltage by $V_2$, and the output load connected to the output terminal by $R_L$. When the input signal $V_1$ is small, both the complementary transistors are conductive and both bias resistors with values $R_1$ and $R_2$ are effectively in parallel and connected in series with the load. Substituting the value $R_1$ for an equal value $R_2$, the ratio of the output voltage to the input voltage is:

$$\frac{V_2}{V_1}=\frac{R_L}{R_L+\frac{R_1}{2}}$$

When the input signal is large and the instantaneous amplitude is high enough to cut off conduction of either one of the transistors, then the voltage gain for a superimposed signal of small amplitude while one transistor is cut off is:

$$\frac{V_2}{V_1}=\frac{R_L}{R_L+R_1}$$

The obvious non-linearity in the output circuit produces distortion which may be typically about one percent.

Amplifiers according to the present invention are especially adaptable to communication systems where each signal circuit uses a plurality of amplifiers in cascade. Since the distortion of each amplifier is very low, the total distortion in each circuit is low. The power required for operation is not as low as it is for strictly class AB amplifiers, but it is always a constant value that is less than that required for class A amplifiers.

The present amplifier exhibits class A and class AB characteristics. Like class A, the dissipation in the transistors 1 and 2 is greatest when an input signal is not present becauses the bias control circuit causes a constant direct-current flow equal to a predetermined average emitter-collector current flow as required for maximum desired levels of signal. Like class B operation, the output transistors are alternately cut off during application of large signal.

Although the present amplifier has been described with reference to a single embodiment, the bias control circuit may be incorporated in other amplifiers in ways obvious to those skilled in the art without departing from the true spirit and scope of the following claims.

What is claimed is:

1. A low-distortion push-pull amplifier comprising:
a pair of transistors of opposite conductivity types connected in a complementary-symmetry arrangement, each of said transistors having an emitter, a base, and a collector, said emitters being connected directly together, said emitters and said collectors forming a series collector-emitter circuit,
a source of direct current,
a load connected between said emitters and said source,
a series resistor,
a bypass capacitor connected in parallel with said series resistor,
said parallel resistor and capacitor circuit being connected in series with said collector-emitter circuit and said source of direct current,
means for applying a signal to both of said bases, the average current flow through said series resistor tending to increase with an increase in amplitude of said signal over a range which causes cross-over conductivity to said load as a result of class AB operation of said push-pull amplifier,
a direct-current amplifier having an input circuit and an output circuit,
a constant-voltage circuit, said input circuit of said direct-current amplifier and said constant-voltage circuit being serially connected across said parallel resistor and capacitor circuit to sense a difference between the voltage of said constant-voltage circuit and the average voltage developed across said resistor by the current flow in said series collector-emitter circuit,
and a voltage divider, said output circuit of said direct-current amplifier including said voltage divider connected to said source of direct-current, said voltage divider having a respective tap connected to each of said bases,
said direct-current amplifier being operative in response to a change in said average current flow through said resistor to change the bias on said bases in such direction to oppose said change in said average current flow, and thereby to maintain said average current flow substantially constant at a value determined by the voltage of said constant-voltage circuit regardless of the changing amplitude of said input signal within the normal class AB operating range of said push-pull amplifier.

2. A push-pull amplifier according to claim 1 wherein said direct-current amplifier comprises a third transistor having an emitter, a base, and a collector, said input circuit of said direct-current amplifier comprising the emitter-base circuit of said third transistor connected to said reference voltage circuit and to said series resistor, and said output circuit of said direct-current amplifier comprising said collector of said third transistor connected to said voltage divider.

3. A push-pull amplifier according to claim 2, wherein said reference voltage circuit comprises a breakdown diode, and a second resistor connected in series with said diode across said source of direct current, said base of said third transistor being connected to said diode at the interconnection with said second resistor.

References Cited

UNITED STATES PATENTS

| | | | |
|---|---|---|---|
| 3,262,062 | 7/1966 | Langan | 330—24 |
| 3,281,703 | 9/1966 | Bladen | 330—13 |
| 3,319,086 | 5/1967 | Yee | 330—15 |

ROY LAKE, *Primary Examiner.*

L. J. DAHL, *Assistant Examiner.*

U.S. Cl. X.R.

330—15, 22